United States Patent
Tsutsumi et al.

(10) Patent No.: US 9,992,898 B2
(45) Date of Patent: Jun. 5, 2018

(54) ELECTRONIC DEVICE HAVING AN ATTRIBUTE INFORMATION DISPLAY PART

(71) Applicant: YOKOGAWA ELECTRIC CORPORATION, Musashino-shi, Tokyo (JP)

(72) Inventors: Takahiro Tsutsumi, Musashino (JP); Yasuhiro Owaki, Musashino (JP); Kouichirou Shimamura, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days. days.

(21) Appl. No.: 14/886,519

(22) Filed: Oct. 19, 2015

(65) Prior Publication Data
US 2016/0128211 A1    May 5, 2016

(30) Foreign Application Priority Data

Nov. 5, 2014 (JP) ................................ 2014-225137

(51) Int. Cl.
H05K 7/14         (2006.01)

(52) U.S. Cl.
CPC ......... H05K 7/1481 (2013.01); H05K 7/1469 (2013.01)

(58) Field of Classification Search
None
See application file for complete search history.

(56) References Cited

U.S. PATENT DOCUMENTS

| 4,738,632 | A | * | 4/1988 | Schmidt | H05K 7/1441 361/729 |
| 4,920,453 | A | * | 4/1990 | Onose | H05K 7/1469 361/679.21 |
| 5,043,847 | A | * | 8/1991 | Deinhardt | H05K 7/1469 361/725 |
| 5,067,785 | A | * | 11/1991 | Schirbl | H05K 7/1461 385/147 |
| 5,253,140 | A | * | 10/1993 | Inoue | H05K 7/1468 16/429 |

(Continued)

FOREIGN PATENT DOCUMENTS

| CN | 85103583 A | 2/1987 |
| DE | 3243132 A1 | 5/1984 |

(Continued)

OTHER PUBLICATIONS

Communication dated Jul. 14, 2016, from the European Patent Office in counterpart European Application No. 15189305.4.

(Continued)

Primary Examiner — Binh Tran
Assistant Examiner — Douglas Burtner
(74) Attorney, Agent, or Firm — Sughrue Mion, PLLC (57) ABSTRACT

An electronic device includes a base plate, and a plurality of modules detachably attached to the base plate. The modules comprise a terminal block module. The terminal block module has an openable and closable door at a pullout end portion-side. The door has an attribute information display part configured to display attribute information of a device to be connected to the terminal block module.

12 Claims, 8 Drawing Sheets

(56) References Cited

U.S. PATENT DOCUMENTS

| | | | | |
|---|---|---|---|---|
| 5,313,372 A * | 5/1994 | Chabert | H01R 9/223 |
| | | | 361/823 |
| 5,836,786 A * | 11/1998 | Pepe | H01R 13/518 |
| | | | 439/540.1 |
| 6,039,414 A * | 3/2000 | Melane | H05K 7/18 |
| | | | 220/812 |
| 6,104,616 A * | 8/2000 | Benson, Jr. | H05K 7/1461 |
| | | | 312/223.2 |
| 6,172,876 B1 * | 1/2001 | Benson, Jr. | H05K 7/1467 |
| | | | 312/223.2 |
| 6,311,229 B1 * | 10/2001 | Burchard | G06F 13/409 |
| | | | 361/600 |
| 6,551,111 B1 * | 4/2003 | Watanabe | H01R 9/223 |
| | | | 361/727 |
| 2008/0157906 A1 * | 7/2008 | Oh | H01H 71/08 |
| | | | 335/202 |
| 2010/0024169 A1 * | 2/2010 | Self | A47K 3/36 |
| | | | 16/354 |
| 2013/0240235 A1 * | 9/2013 | Higashihama | H01H 9/02 |
| | | | 174/53 |

FOREIGN PATENT DOCUMENTS

| | | |
|---|---|---|
| JP | 2001-94221 A | 4/2001 |
| JP | 2011-187686 A | 9/2011 |
| JP | 2012-134352 A | 7/2012 |

OTHER PUBLICATIONS

Communication dated Aug. 16, 2016, issued by the Japanese Patent Office.

* cited by examiner

--Prior Art--

ELECTRONIC DEVICE HAVING AN ATTRIBUTE INFORMATION DISPLAY PART

CROSS-REFERENCE TO RELATED APPLICATION

The present application claims priority from Japanese Patent Application No. 2014-225137 filed on Nov. 5, 2014, the entire content of which is incorporated herein by reference.

BACKGROUND

Technical Field

The present disclosure relates to an electronic device, and more specifically, to an electronic device having a base plate and a plurality of modules detachably attached to the base plate.

Related Art

An electronic device has been known which has a base plate and a plurality of modules detachably attached to the base plate.

Figure 6:
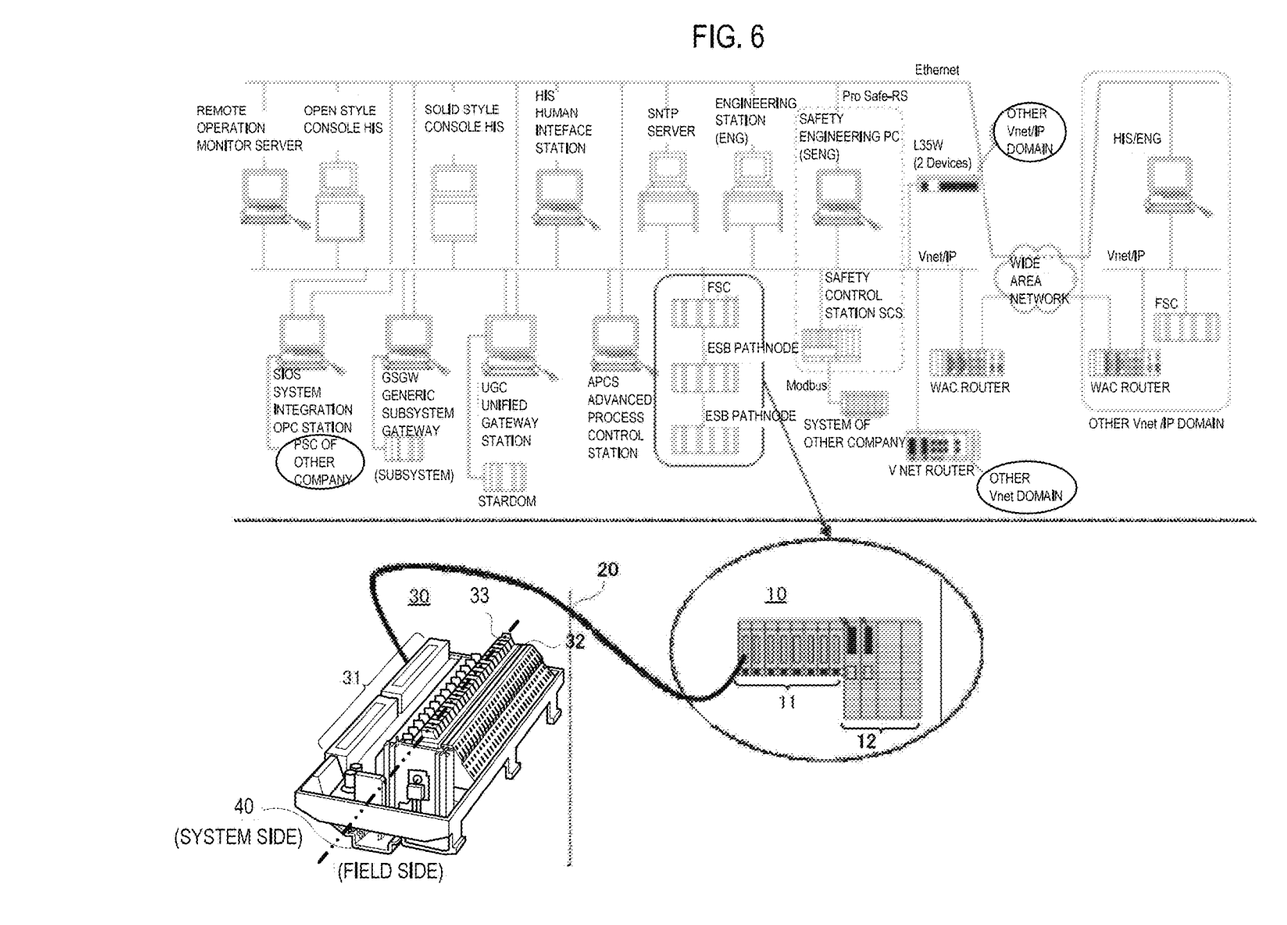
FIG. 6 is a block diagram illustrating an example of a control system of the related art.

FIG. 6 is a block diagram illustrating an example of a control system configured using the electronic device. In a field control station 10 of FIG. 6, a plurality of input and output modules 11 and a variety of function modules 12 such as a power supply module and a control module configured to control transmission and reception of various signals to and from an upper system are detachably fitted and connected to a first terminal board provided on a base plate (not shown).

The field control station 10 is connected to a second terminal board 30 through a cable 20. The second terminal board 30 is provided with connectors 31 to which the cables 20 of a system-side are detachably fitted and connected through connectors (not shown), a terminal block 32 to which a wiring of a field device such as a sensing device, a motor, a valve and the like of a field-side is connected, a disconnection member 33 configured to mechanically disconnect a signal system, which is configured to mechanically and electrically connect the connectors 31 and the terminal block 32, as required, and the like.

The disconnection member 33 is provided so as to individually check a status of the system-side or field-side of each signal system upon activation or repair of the system. When the disconnection member 33 of the corresponding signal system is removed from the second terminal board 30, the signal input/output system configured to transmit and receive a signal between the system-side and the field-side is mechanically disconnected.

The field control station 10 and the terminal board 30 are detachably attached to a DIN rail, for example. FIG. 6 illustrates a state where a backside of the terminal board 30 is attached to a DIN rail 40.

Figure 7A:
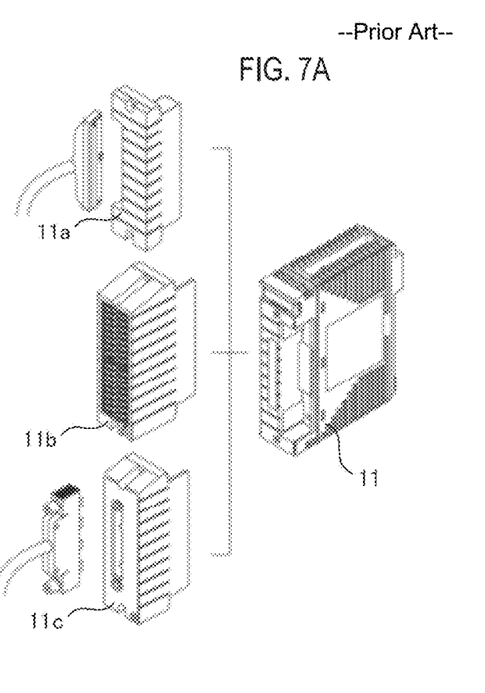
FIGS. 7A to 7C are views illustrating a specific configuration example of an input and output module 11 illustrated in FIG. 6.
Figure 7B:
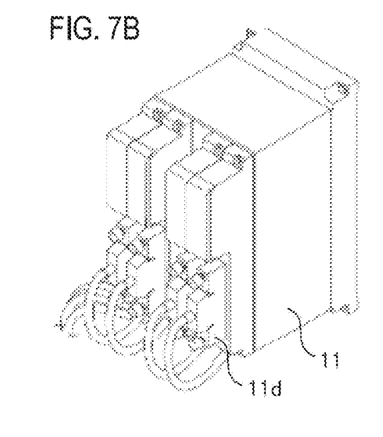
Figure 7C:
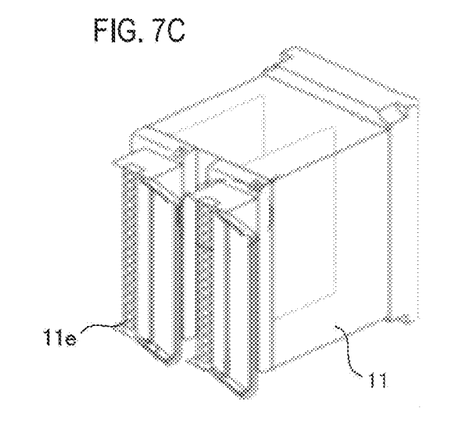

FIGS. 7A to 7C are views illustrating a specific configuration example of the input and output module 11 in FIG. 6. FIG. 7A illustrates an example where a plurality of types of terminal blocks 11a, 11 b, 11c capable of being detachably attached to a front surface of the input and output module 11 is prepared and replaced and attached depending on the intended purpose. FIG. 7B illustrates an example where cables are connected to the input and output module 11 through connectors 11d. FIG. 7C illustrates an example where the input and output module 11 is provided with a terminal board 11e having a cover part attached thereto for connecting a signal line. The input and output modules 11 are also attached to the DIN rail (not shown).

Figure 8A:
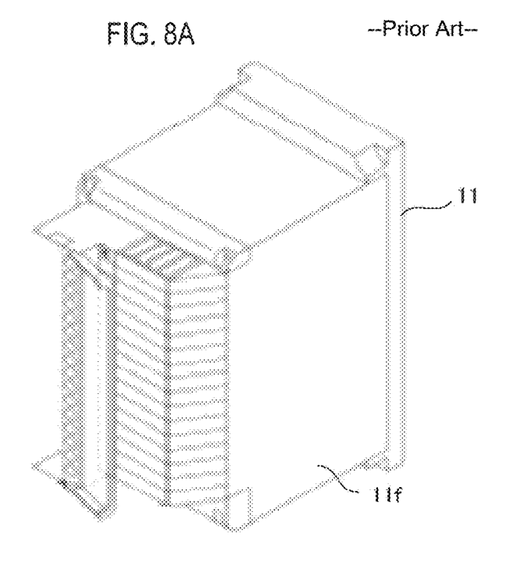
FIGS. 8A to 8C are views illustrating another specific configuration example of the input and output module 11 illustrated in FIG. 6.
Figure 8B:
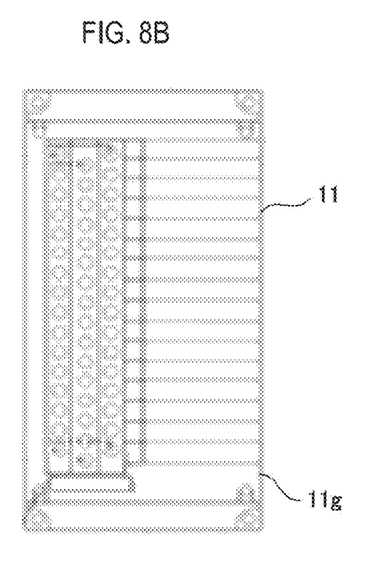
Figure 8C:
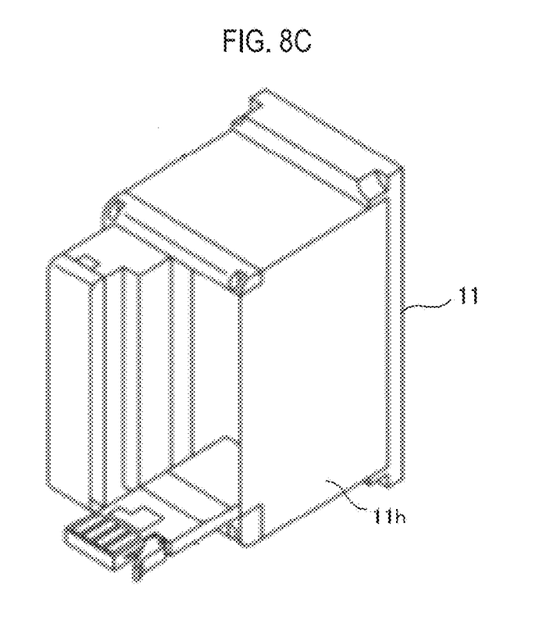

FIGS. 8A and 8B are views illustrating another specific configuration example of the input and output module 11 in FIG. 6. FIGS. 8A and 8B illustrate configurations where cases 11f, 11g of the input and output modules 11 having a large amount of heat generation are made of an aluminum material having a favorable thermal conductivity, and FIG. 8C illustrates a configuration where an entire nest (enclosure) 11h is made of the aluminum material. The input and output modules 11 are also attached to the DIN rail (not shown).

Patent Document 1 discloses a configuration of a DIN rail-attachable terminal board that can be fixed to the DIN rail so as not to sideways slip with a minimum space and has a substrate accommodated in a metallic case.

[Patent Document 1] Japanese Patent Application Publication No. 2012-134352A

According to the control system illustrated in FIG. 6, the terminal boards 30 to which the wirings of the field control station 10 and the field device are connected are configured as individual devices independently of each other, so that each terminal board is attached to the DIN rail 40 and is connected through the cable 20.

When an operator performs maintenance and inspection, adjustment setting and the like for the control system, the operator should have a separately prepared list indicating the allocation of the respective field devices with respect to the respective terminals of the terminal block 32 at hand and refer to the same so as to check the attribute information such as a type and a name of the field device to be connected to the terminal block 32 of the terminal board 30 through the wiring, a wiring signal name and the like. Therefore, the workability and the operability are poor.

SUMMARY

Exemplary embodiments of the invention provide an electronic device having excellent workability and operability capable of quickly checking the attribute information of each field device to be connected to each terminal of a terminal block at an installation site of the terminal board, as required.

An electronic device according to an exemplary embodiment, comprises:
a base plate; and
a plurality of modules detachably attached to the base plate,
wherein the modules comprise a terminal block module, and
wherein the terminal block module has an openable and closable door at a pullout end portion-side, and the door has an attribute information display part configured to display attribute information of a device to be connected to the terminal block module.

The attribute information display part may be provided at the door in a state that the attribute information display part is openable and closable.

The device to be connected to the terminal block module may be a field device that is to be installed at a field-side of a control system.

By the above configurations, the operator can check the attribute information of the respective field devices to be connected to the respective terminals of the terminal block by opening the door provided at the pullout end portion-side of the terminal block module at the installation side of the terminal board, so that it is possible to implement the electronic device having excellent workability and operability.

DETAILED DESCRIPTION

Figure 1A:
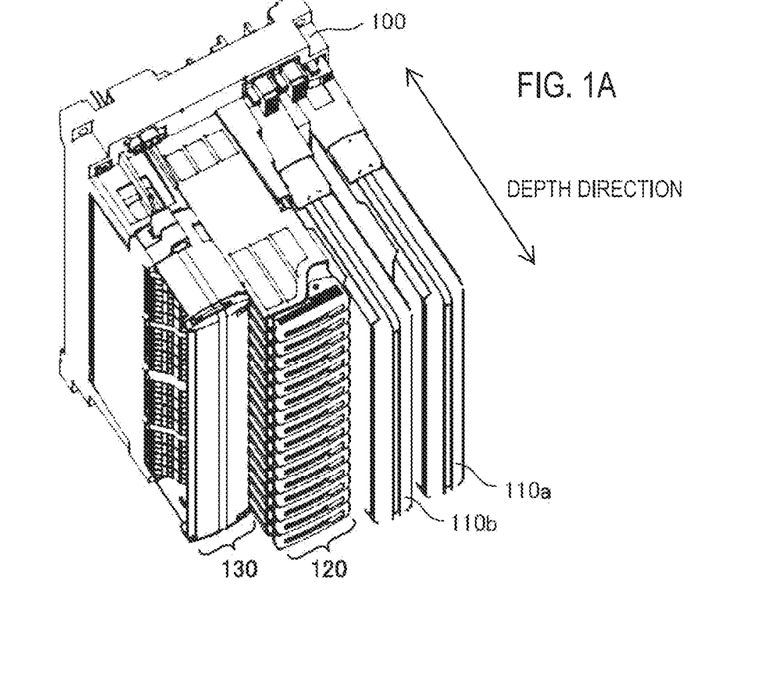
FIGS. 1A and 1B are views illustrating a configuration of an exemplary embodiment of an electronic device according to the present invention.
Figure 1B:
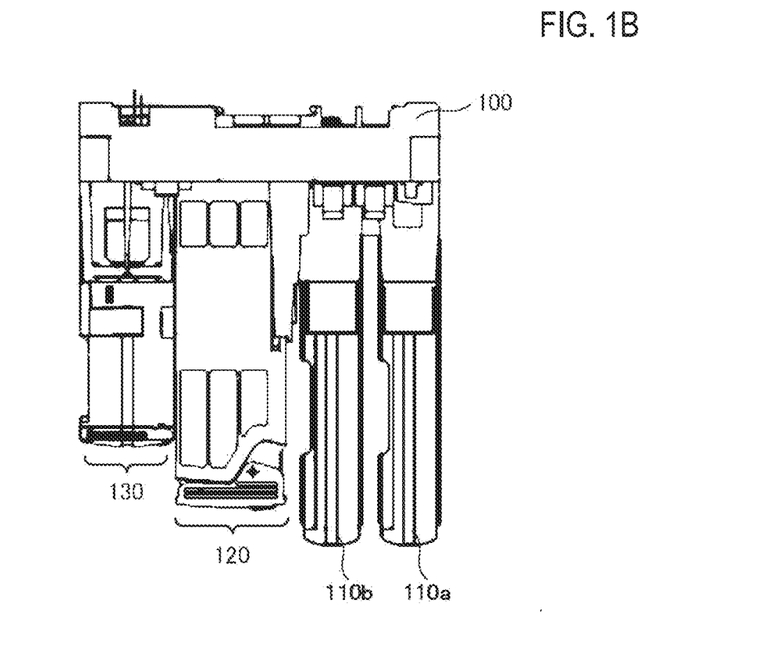
Figure 2A:
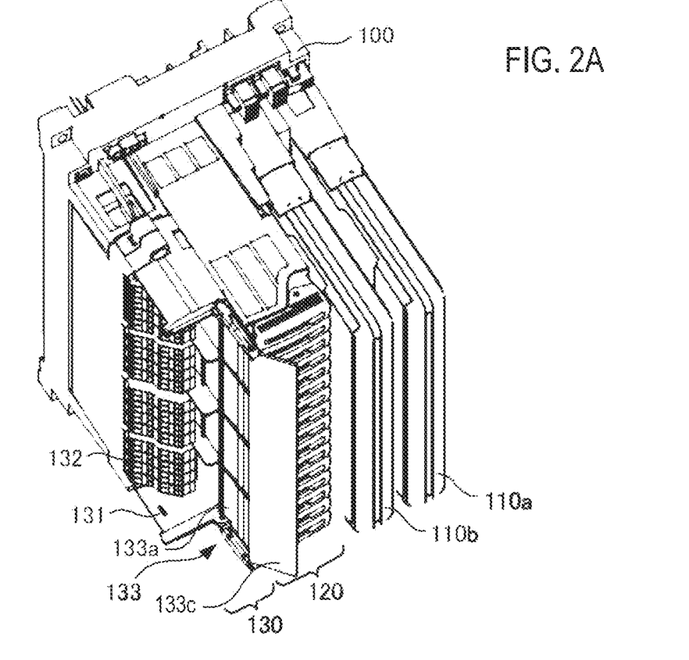
FIGS. 2A and 2B are views illustrating a configuration of the exemplary embodiment of the electronic device according to the present invention.
Figure 2B:
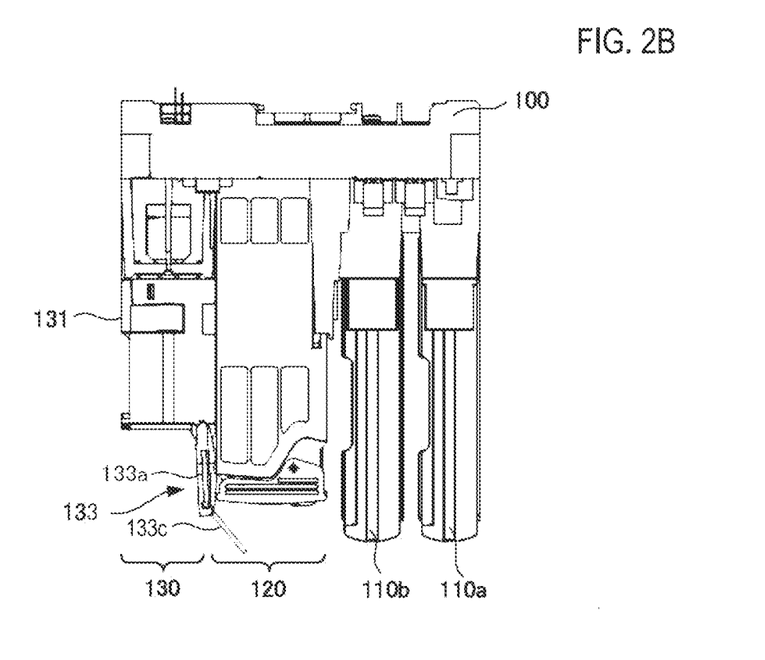

Hereinafter, exemplary embodiments of the present invention will be described in detail with reference to the drawings. FIGS. 1A to 2B show a configuration of an exemplary embodiment of an electronic device according to the present invention, in which FIG. 1A is an overall perspective view, FIG. 1B is a top view, FIGS. 1A and 1B illustrate a closed state of a door 133 of a terminal block module 130, and FIGS. 2A and 2B illustrate an opened state of the door 133 of the terminal block module 130.

In FIGS. 1A to 2B, two input and output modules 110a, 110b having the same function are fitted and connected to a front surface of a base plate 100 through connectors (not shown). A plurality of plug-in modules 120 serving as functional modules having predetermined option functions are also fitted and connected to the front surface of the base plate 100 through connectors (not shown). Further, a terminal block module 130 having a plurality of terminal blocks are fitted and connected to the front surface of the base plate 100 through a connector (not shown). It is possible to easily attach and detach the respective modules by an access operation from the front surface. In the meantime, a backside of the base plate 100 is detachably attached to a DIN rail (not shown).

Lengths of the two input and output modules 110a, 110b, the plurality of plug-in modules 120 and the terminal block module 130 in a depth direction (arrow in FIG. 1A) are designed so that respective end surfaces of pullout end portion-side (which are the end surfaces at a side opposite to a side facing the front surface of the base plate 100) form a step shape from one side of the base plate 100 towards the other side at a state where the respective modules are attached to the base plate 100.

In this exemplary embodiment, the end surfaces of the pullout end portion-side of the input and output module 110a, 110b, the plurality of plug-in modules 120 and the terminal block module 130 attached to the base plate 100 (more specifically, the protruding amount of the end surface of the one module with respect to the end surfaces of the other modules) are set so that a relation of the input and output modules 110a, 110b>the plug-in modules 120>the terminal block module 130 is satisfied.

The two input and output modules 110a, 110b are configured to operate as a master/slave relation. That is, the input and output modules are configured to redundantly operate so that when the one input and output module (for example, 110a) operating as a master, for example, is out of order, the other input and output module (for example, 110b) operating as a slave, for example, alternatively operates as a master. Thereby, it is possible to minimize the operation stop caused due to the failure of the input and output module 110.

The plug-in modules 120 are configured to individually add the option functions, which are not provided for the input and output modules 110a, 110b, such as a signal conversion function by a relay, an insulation function, a disconnection function, a fuse function and the like, to each signal system. On front surfaces of the pullout end portion-side of the plug-in modules 120, a front surface lever is provided to cover the front surfaces of the plug-in modules 120 and a part adjacent to one end of the front surface lever can be rotated with respect to an attachment shaft.

The plug-in module 120 is provided with a disconnection function, for example, as the option function, so that it is possible to omit the disconnection member 33 provided for the terminal board 30 of the relate art. Also, the plug-in module 120 is provided with a fuse function, so that it is possible to omit the fuse provided for the terminal board 30 of the relate art.

The terminal block module 130 has a housing 131, a plurality of terminal blocks 132 accommodated in the housing 131, and a door 133 provided on a front surface of the housing 131, which is a pullout end portion-side, in a state that the door 133 is openable and closable.

Figure 3:
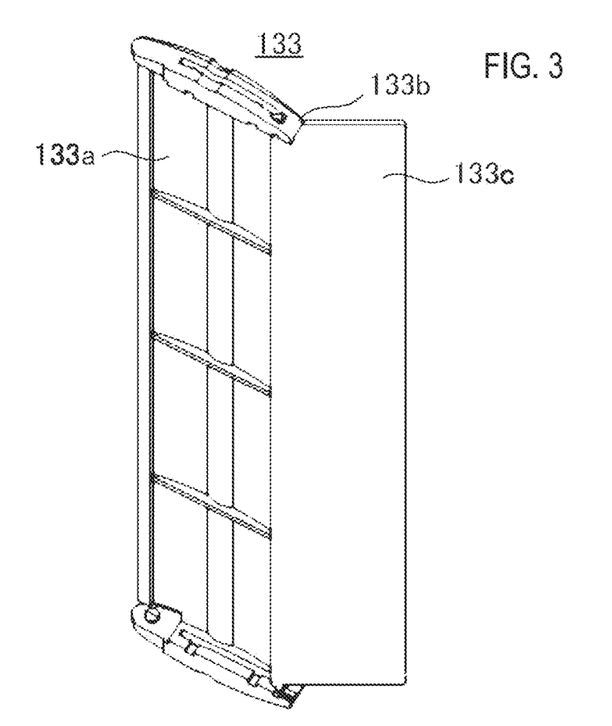
FIG. 3 is a view illustrating a configuration of a specific example of a door 133.

FIG. 3 depicts a configuration of a specific example of the door 133. The door 133 has a main body 133a and an attribute information display part 133c provided at an opening operation side 133b of the main body 133a in a state that the attribute information display part 133c is openable and closable.

On the attribute information display part 133c, the attribute information such as types, names and the like of field devices to be connected to respective terminals of the terminal blocks 132, which are provided for the terminal block module 130 through wirings is described in correspondence to the respective terminals.

Here, as shown in FIG. 2B, the door 133 of the terminal block module 130 is configured so that when the door 133 is opened at the state where the input and output modules 110a, 110b, the plurality of plug-in modules 120 and the terminal block module 130 are attached to the base plate 100, the opening operation side 133b of the main body 133a of the door 133 more protrude than the end surfaces of the pullout end portion-side of the plug-in modules 120.

Thereby, even though the end surface height of the pullout end portion-side (or the length in the depth direction from the base plate 100 to the end surface of the pullout end portion-side) of the terminal block module 130 is lowest (or shortest) as compared to the end surface heights of the input and output modules 110a, 110b and the plurality of plug-in module 120 at the state where the input and output modules 110a, 110b, the plurality of plug-in modules 120 and the terminal block module 130 are attached to the base plate 100, when the door 133 is opened, the opening operation side 133b of the main body 133a of the door 133 more protrude forwards than the end surfaces of the pullout end portion-side of the plug-in modules 120.

As a result, an operator can rotate the attribute information display part 133c to any angle beyond 180° (in this embodiment, in a counterclockwise direction as viewed from above) without being disturbed by the end surfaces of the pullout end portion-side of the plug-in modules 120 adjacent to the terminal block module 130. Therefore, the operator can set the rotating angle of the attribute information display part 133c to a desired angle at which it is possible to read the attribute information most easily, thereby efficiently performing the maintenance and inspection, the adjustment setting and the like of the control system.

Figure 4A:
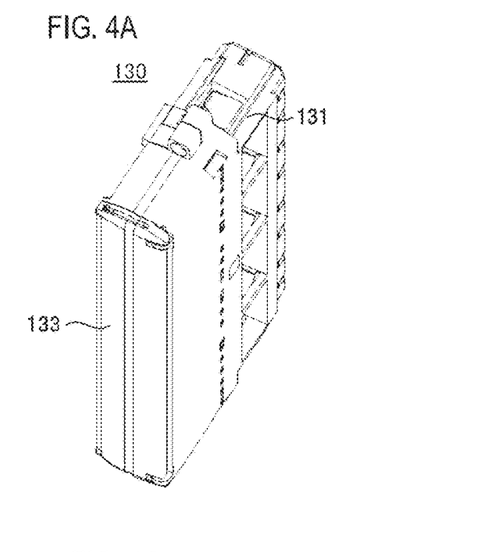
FIGS. 4A to 4D are views illustrating a configuration of a specific example of a terminal block module 130.
Figure 4B:
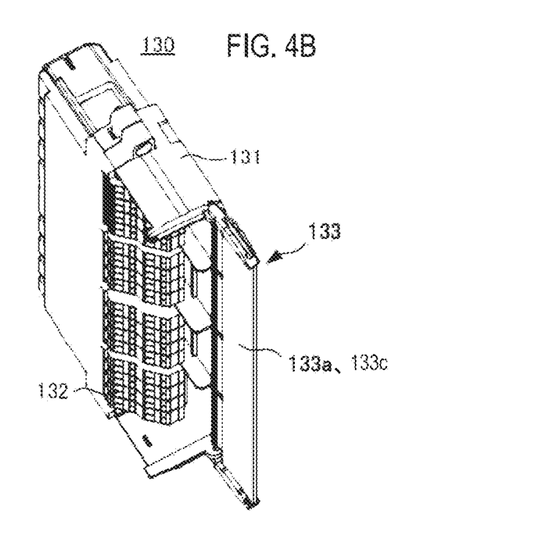
Figure 4C:
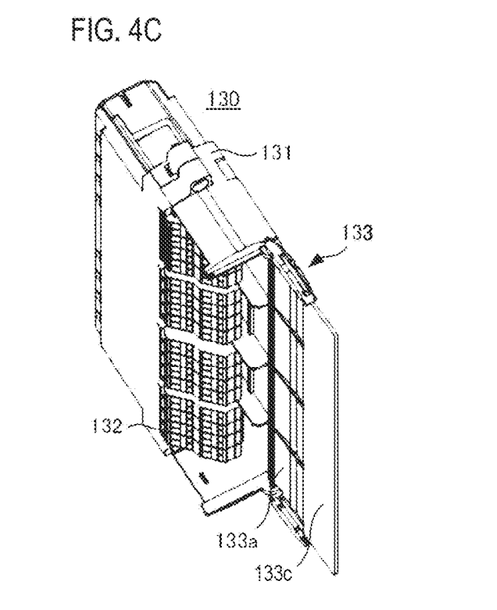
Figure 4D:
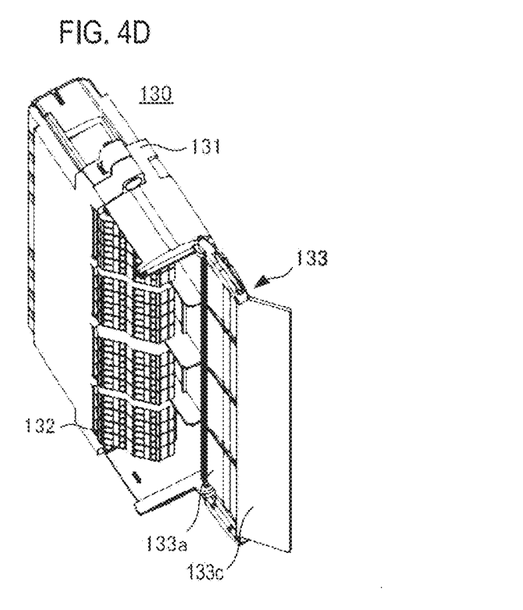

FIGS. 4A to 4D are views illustrating a configuration of a specific example of the terminal block module 130, in which FIG. 4A illustrates a closed state of the door 133, FIG. 4B illustrates a state where the main body 133a of the door 133 is opened about by 90° (in the embodiment, in the counterclockwise direction as viewed from above) and the attribute information display part 133c is closed, FIG. 4C illustrates a state where the attribute information display part 133c is also opened about by 180° (in the embodiment, in the counterclockwise direction) from the state of FIG. 4B to be substantially flush with the main body 133a, and FIG. 4D illustrates a state where the attribute information display part 133c is further opened from the state of FIG. 4C (in the embodiment, in the counterclockwise direction).

Figure 5A:
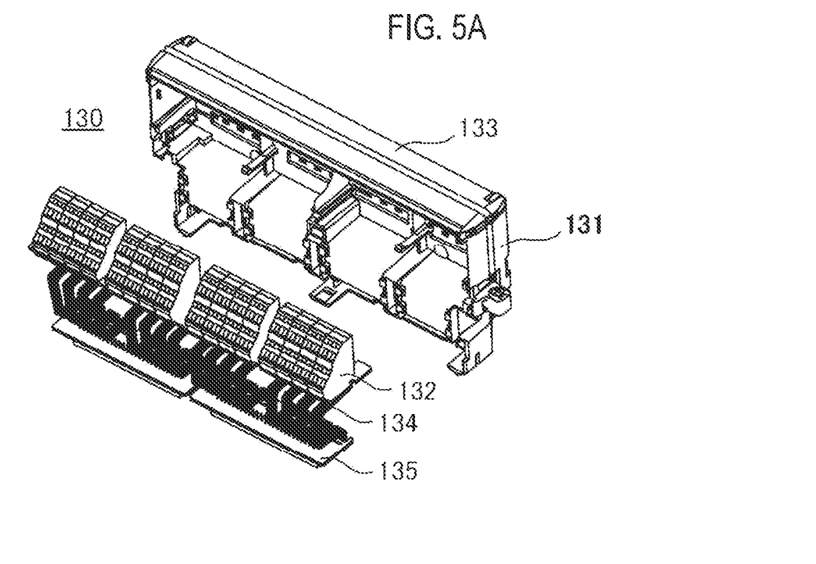
FIGS. 5A and 5B are views illustrating a configuration of a specific example of the terminal block module 130.
Figure 5B:
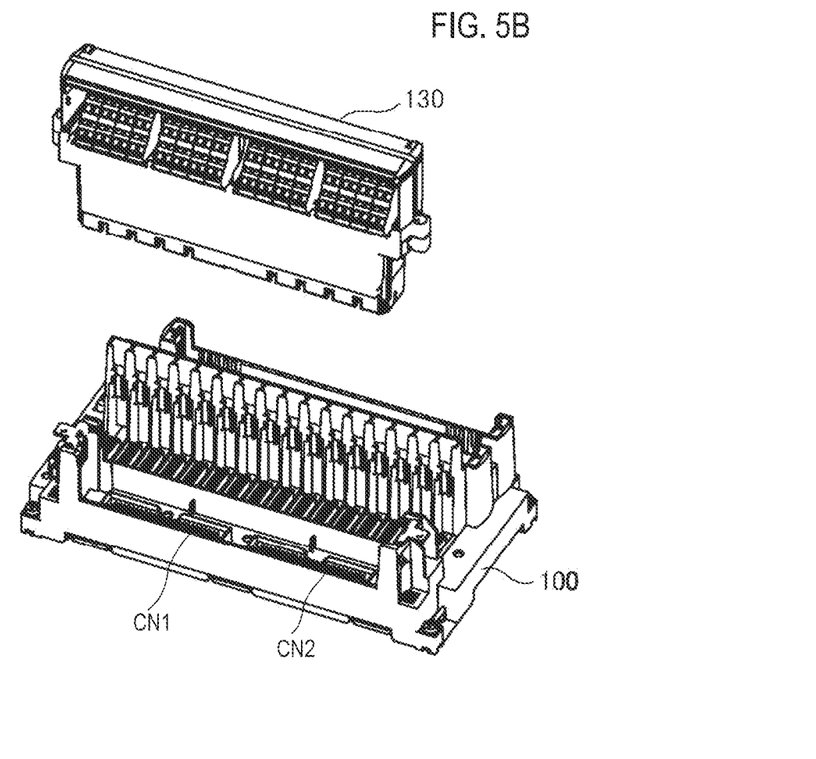

FIGS. 5A and 5B are views illustrating a configuration of a specific example of the terminal block module 130, in which FIG. 5A is an assembling configuration view and FIG. 5B illustrates attachment and detachment of the terminal block module 130 to and from the base plate 100. In FIG. 5, connection pins (not shown) of the terminal blocks 132 are accommodated in the housing 131 with being connected to connectors (not shown) provided for a printed wiring board 135 through flexible printed wirings 134 and are thus integrated as the terminal block module 130. In the meantime, the printed wiring board 135 is attached to the housing 131 so that it can slightly move in a horizontal direction of the board.

When attaching and detaching the terminal block module 130 to and from the base plate 100, it is possible to attach and detach the terminal block module 130 in a short time and to relax a tolerance condition at the assembly of the terminal block module 130, as compared to a case where the printed wiring board 135 is fixed, because the printed wiring board 135 configuring the terminal block module 130 can slightly move in the horizontal direction of the board so that the connectors (not shown) provided for the printed wiring board 135 are smoothly fitted and connected to connectors CN1, CN2 provided for the base plate 100. That is, it is possible to effectively perform the assembling operation.

As described above, according to the present invention, the electronic device is configured to detachably attach the plurality of modules to the base plate, so that it is possible to implement the electronic device having excellent workability and operability.

What is claimed is:

1. An electronic device comprising: a base plate; and
 a plurality of modules detachably attached to the base plate in a depth direction,
 wherein the modules comprise a terminal block module, and
 wherein the terminal block module has an openable and closable door at a pullout end portion-side, and the door has an attribute information display part configured to display attribute information of a device to be connected to the terminal block module,
 wherein a length of the terminal block module in the depth direction is smaller than a length of an adjacent module attached adjacent to the terminal block module,
 wherein the door of the terminal block module is configured to be openable such that an opposite side to a side of the door which is connected to the terminal block module protrudes further frontward than an end surface of the adjacent module on the pullout end portion-side,
 wherein the attribute information display part is configured to slide along the door, and
 wherein a proximal end of the attribute information display part is further configured to rotate about a distal end of the door when the door is in an opened position.

2. The electronic device according to claim 1, wherein the attribute information display part is provided at the door in a state that the attribute information display part is openable and closable.

3. The electronic device according to claim 1, wherein the device to be connected to the terminal block module is a field device that is to be installed at a field-side of a control system.

4. The electronic device according to claim 2, wherein the device to be connected to the terminal block module is a field device that is to be installed at a field-side of a control system.

5. The electronic device according to claim 1, wherein the attribute information display part is further configured to slide along a track of the door.

6. The electronic device according to claim 5, wherein the track is disposed at a top portion and bottom portion of the door.

7. An electronic device comprising: a base plate; and
 a plurality of modules detachably attached to the base plate in a depth direction,
 wherein the modules comprise a terminal block module, and
 wherein the terminal block module has an openable and closable door at a pullout end portion-side, and the door has an attribute information display part configured to display attribute information of a device to be connected to the terminal block module,
 wherein a length of the terminal block module in the depth direction is smaller than a length of an adjacent module attached adjacent to the terminal block module,
 wherein the door of the terminal block module is configured to be openable such that an opposite side to a side of the door which is connected to the terminal block module protrudes further frontward than an end surface of the adjacent module on the pullout end portion-side, and
 wherein the attribute information display part is configured to slide along the door
 wherein the attribute information display part is further configured to pivot, the attribute information display part having been slid along the door.

8. The electronic device of claim 1, wherein the attribute information display part is configured to slide along a width of the door.

9. The electronic device of claim 1, wherein the attribute information faces a same direction as an interior side of the door when sliding along the door.

10. The electronic device of claim 1, wherein a proximal end of the terminal block module and a proximal end of the adjacent module are parallel to one another, the terminal block module and the adjacent module being attached to the base plate.

11. The electronic device according to claim 1, wherein a pullout end of the adjacent module protrudes farther in the depth direction than the pullout end of terminal block module.

12. An electronic device comprising:
- a base plate; and
- a plurality of modules detachably attached to the base plate in a depth direction,
- wherein the modules comprise a terminal block module, and
- wherein the terminal block module has an openable and closable door at a pullout end portion-side, and the door has an attribute information display part configured to display attribute information of a device to be connected to the terminal block module,
- wherein a length of the terminal block module in the depth direction is smaller than a length of an adjacent module attached adjacent to the terminal block module,
- wherein the door of the terminal block module is configured to be openable such that an opposite side to a side of the door which is connected to the terminal block module protrudes further frontward than an end surface of the adjacent module on the pullout end portion-side,
- wherein the attribute information display part is configured to slide along the door,
- wherein the door includes a first end portion which is rotatably connected to the terminal block module and a second end portion opposite to the first end portion, and
- wherein one side of the attribute information display part is configured to slide from the first end portion to the second end portion, and the attribute information display part is rotatable at the second end portion of the door.

* * * * *